(12) United States Patent
Takayama et al.

(10) Patent No.: US 8,922,402 B2
(45) Date of Patent: Dec. 30, 2014

(54) OFFSET CORRECTION DEVICE OF COMPARATOR

(75) Inventors: Masao Takayama, Osaka (JP); Kazuo Matsukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 298 days.

(21) Appl. No.: 13/564,496

(22) Filed: Aug. 1, 2012

(65) Prior Publication Data

US 2012/0293346 A1 Nov. 22, 2012

Related U.S. Application Data

(63) Continuation of application No. PCT/JP2010/004272, filed on Jun. 28, 2010.

(30) Foreign Application Priority Data

Mar. 16, 2010 (JP) ................................ 2010-059207

(51) Int. Cl.
| | |
|---|---|
| *H03M 1/06* | (2006.01) |
| *H03K 5/24* | (2006.01) |
| *H03M 1/10* | (2006.01) |
| *H03K 3/356* | (2006.01) |
| *H03M 1/36* | (2006.01) |

(52) U.S. Cl.
CPC ............. *H03M 1/1023* (2013.01); *H03K 5/249* (2013.01); *H03M 1/36* (2013.01); *H03K 5/2481* (2013.01); *H03K 3/356139* (2013.01)
USPC ............................. 341/118; 341/155; 341/120

(58) Field of Classification Search
CPC ... H03K 5/2481; H03K 5/249; H03M 1/1023; H03M 1/36; H03M 1/00
USPC .................... 341/118, 120, 172, 165
See application file for complete search history.

(56) References Cited

U.S. PATENT DOCUMENTS

| | | | |
|---|---|---|---|
| 6,433,712 B1 * | 8/2002 | Ohnhaeuser et al. | 341/118 |
| 6,720,896 B2 * | 4/2004 | Semmler et al. | 341/120 |

(Continued)

FOREIGN PATENT DOCUMENTS

| | | |
|---|---|---|
| CN | 101145786 A | 3/2008 |
| CN | 101610070 A | 12/2009 |

(Continued)

OTHER PUBLICATIONS

International Search Report issued in International Patent Application No. PCT/JP2010/004272, mailed Jul. 20, 2010.

(Continued)

*Primary Examiner* — Jean B Jeanglaude
(74) *Attorney, Agent, or Firm* — McDermott Will & Emery LLP

(57) ABSTRACT

A comparator offset correction device opens an open switch 205 and closes a short-circuit switch 204 in offset correction of a comparator 201. In this state, a controller 203 allows the comparator 201 to repeat, more than once, the operation of comparing reference voltages 101 input to two input terminals with each other. The filter 202 outputs a frequency signal obtained by smoothing a plurality of comparison results. Based on the frequency signal from the filter 202, the controller 203 outputs a threshold value control signal to the comparator 201 so that the ratio of a high-level voltage to a low-level voltage in the results of the comparison in the comparator 201 is 50%. Thus, even when a current which will be input may differ from a current which is currently input due to, for example, the influence of noise, the threshold value offset amount is normally corrected.

10 Claims, 4 Drawing Sheets

(56) References Cited

U.S. PATENT DOCUMENTS

| | | |
|---|---|---|
| 6,822,501 B2 | 11/2004 | Kinugasa |
| 2004/0178839 A1 | 9/2004 | Kinugasa |
| 2008/0143577 A1* | 6/2008 | Tomisawa et al. ............ 341/165 |
| 2009/0002216 A1* | 1/2009 | Joet et al. ..................... 341/172 |
| 2009/0068958 A1 | 3/2009 | Nakamura |

FOREIGN PATENT DOCUMENTS

| | | |
|---|---|---|
| EP | 0831592 A1 | 3/1998 |
| JP | 07-115348 A | 5/1995 |
| JP | 10-065542 | 3/1998 |
| JP | 10-065542 A | 3/1998 |
| JP | 2002-319863 | 10/2002 |
| JP | 2004-361327 A | 12/2004 |
| JP | 2008-085898 A | 4/2008 |
| JP | 2010-016737 | 1/2010 |
| JP | 2010-016737 A | 1/2010 |

OTHER PUBLICATIONS

English translation of Chinese Search Report issued in Chinese application No. 201080065415.7 dated Sep. 26, 2014.

* cited by examiner

OFFSET CORRECTION DEVICE OF COMPARATOR

CROSS-REFERENCE TO RELATED APPLICATION

This is a continuation of PCT International Application PCT/JP2010/004272 filed on Jun. 28, 2010, which claims priority to Japanese Patent Application No. 2010-059207 filed on Mar. 16, 2010. The disclosures of these applications including the specifications, the drawings, and the claims are hereby incorporated by reference in their entirety.

BACKGROUND

The present disclosure relates to improved comparator offset correction devices.

When transistors included in comparators have fabrication variations, the threshold value of the comparators differs from a reference voltage due to the fabrication variations. For this reason, A/D conversion, or the like using comparators requires correction of the threshold value of the comparators in order to achieve highly accurate conversion.

Conventionally, in correcting the threshold value, the amount of offsets of comparators first has to be measured. In methods for measuring the offsets, as described in, for example, U.S. Pat. No. 6,822,501 and Japanese Patent Publication No. 2002-319863, the value of a reference voltage input to one input terminal of a comparator is fixed, an input voltage input to the other input terminal is increased from a voltage lower than the reference voltage to a high voltage to compute a difference between the input voltage and the reference voltage at a time of transition in an output from "0" to "1," the input voltage is reduced from a voltage higher than the reference voltage to a low voltage to compute a difference between the input voltage and the reference voltage at a time of transition in the output from "1" to "0," an average value of the obtained two differences is used an offset amount, and the inner potential, etc. of the comparator is changed based on the offset amount to correct the threshold value of the comparator.

SUMMARY

The conventional offset correction devices can correctly measure the offset amount as long as a voltage which will be input does not differ from a voltage which is actually input. However, when the voltage which will be input differs from the voltage which is actually input, the offset amount may be erroneously measured due to the influence of noise, etc.

An example comparator offset correction device according to the present disclosure removes or reduces the influence of noise in offset correction of the threshold value of a comparator to accurately measure and correct the offset voltage.

An example comparator offset correction device according to the present disclosure includes: a comparator configured to compare an input signal input to a first input terminal with a reference voltage input to a second input terminal; an open switch configured to open a path of the input signal to the first input terminal of the comparator; a short-circuit switch configured to equalize a voltage at the first input terminal of the comparator with a voltage at the second input terminal of the comparator; a controller configured to allow the comparator to perform comparison operation more than once with the open switch being open and the short-circuit switch being closed; and a filter configured to output a frequency signal obtained by smoothing a plurality of comparison results of the comparator, wherein the controller generates a threshold value control signal of the comparator based on the frequency signal of the filter, controls a threshold value of the comparator based on the threshold value control signal, and allows the comparator to perform the comparison operation more than once based on the controlled threshold value.

In the example comparator offset correction device, the filter computes a ratio of an output count of a high-level or low-level voltage to a total number of comparison performed in the comparator, and outputs the obtained ratio as the frequency signal.

In the example comparator offset correction device, when the frequency signal is higher than or lower than 50%, the controller controls the threshold value control signal input to the comparator so that the frequency signal approximates 50%.

In the example comparator offset correction device, when the frequency signal is higher than or lower than 50%, the controller controls threshold value control signal input to the comparator so that the frequency signal approximates 50%.

In the example comparator offset correction device, when a plurality of levels are available for changing the threshold value of the comparator, the controller sequentially outputs threshold value control signals at all the levels to the comparator, and receives frequency signals at all the levels from the filter to determine one of the threshold value control signals which corresponds to a frequency signal most closely approximating 50%.

In the example comparator offset correction device, when a plurality of levels are available for changing the threshold value of the comparator, the controller sequentially outputs threshold value control signals at all the levels to the comparator, and receives frequency signals at all the levels from the filter to determine one of the threshold value control signals which corresponds to a frequency signal most closely approximating 50%.

An example flash A/D converter of the present disclosure includes: the comparator offset correction device described above, wherein the comparator offset correction device includes a plurality of comparator offset correction devices.

In the example flash A/D converter, the plurality of comparator offset correction devices include one shared controller.

An example delta sigma A/D converter of the present disclosure includes: an adder configured to receive an analog signal; an integrator configured to integrate an output of the adder; a quantizer configured to quantize an output of the integrator and output the quantized output as a digital signal; and a D/A converter configured to perform D/A conversion of the digital signal from the quantizer and feed back an analog signal obtained by the D/A conversion to the adder; wherein the quantizer includes the comparator offset correction device described above.

As described above, in the present disclosure, a determination is not made based on a result of comparison performed once in the comparator, but the comparator is allowed to perform comparison operation more than once, and the threshold value of the comparator is corrected based on the frequency signal obtained by smoothing results of comparison performed more than once, which reduces the influence of noise, so that erroneous determinations of the offset amount due to the noise can be reduced.

DETAILED DESCRIPTION

Embodiments of the present invention will be described below with reference to the drawings.

(First Embodiment)

Figure 1:
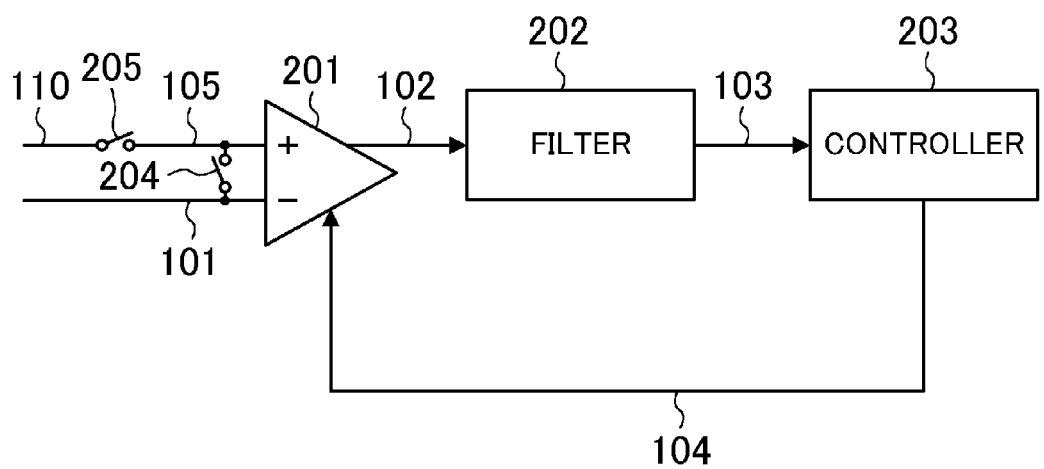
FIG. 1 is a block diagram illustrating a comparator offset correction device according to a first embodiment of the invention.

FIG. 1 illustrates an overall configuration of a comparator offset correction device of a first embodiment of the invention.

In the figure, reference number 201 denotes a comparator, reference number 110 denotes an input signal, reference number 101 denotes a reference voltage, reference number 105 denotes a comparator input, reference number 205 denotes an open switch provided in a path of the input signal 110 to the comparator input 105, reference number 204 denotes a short-circuit switch configured to form a short circuit between a positive input terminal (first input terminal) having a positive polarity and a negative input terminal (second input terminal) having a negative polarity of the comparator 201, reference number 102 denotes a comparison result between the input signal 110 and the reference voltage 101 in the comparator 201, reference number 202 denotes a filter configured to receive the comparison result 102, reference number 103 denotes a high-level frequency signal output from the filter 202, reference number 203 denotes a controller configured to perform correction control of the threshold voltage of the comparator 201, and reference number 104 denotes a threshold value control signal output from the controller 203 to the comparator 201.

In offset correction of the comparator 201, the controller 203 opens the open switch 205 to open the path of an input signal 110 to the positive input terminal having the positive polarity of the comparator input 105, and closes the short-circuit switch 204 to form a short circuit between the positive input terminal having the positive polarity and the negative input terminal having the negative polarity of the comparator 201. Thus, the same reference voltage 101 is input to both the positive input terminal having the positive polarity and the negative input terminal having the negative polarity. In this state, the controller 203 outputs a threshold value control signal 104 to the comparator 201. The comparator 201 compares a threshold value offset set by the threshold value control signal 104 with an offset caused by manufacturing variations of elements such as transistors included in the comparator. When a voltage at the negative input terminal having the negative polarity is higher, the comparator 201 outputs a low-level voltage as a comparison result 102, whereas when the voltage at the negative input terminal having the negative polarity is lower, the comparator 201 outputs a high-level voltage as the comparison result 102.

While the controller 203 is outputting the threshold value control signal 104 having a fixed value, the controller 203 allows the comparator 201 to perform comparison operation a predetermined number of times, where the predetermined number is two or greater. The filter 202 outputs a frequency signal obtained by smoothing a plurality of comparison results 102 from the comparator 201, for example, a high-level frequency signal 103 obtained by computing the frequency of outputting the high-level voltage in the plurality of comparison results from the comparator 201. The easiest computation method is to average the plurality of comparison results 102. Instead of the high-level frequency signal 103, a low-level frequency signal may be used.

Based on the high-level frequency signal 103 from the filter 202, the controller 203 outputs a threshold value control signal 104 to the comparator 201 to control an offset of the threshold value of the comparator 201, thereby correcting the threshold value of the comparator 201. Two specific examples of threshold value correction will be described.

<First Specific Example of Threshold Value Correction>

A first specific example of threshold value correction will be described below. The case where the threshold value control signal 104 controls the threshold value of the comparator 201 in, for example, four levels is considered. In this case, when initially setting the threshold value offset of the threshold value control signal 104 to level "1" results in a high-level frequency signal of 0% (the frequency with which a high-level voltage is output) from the filter 202, next setting the threshold value offset of the threshold value control signal 104 to level "2" results in a high-level frequency signal of 20%, subsequently setting the threshold value offset of the threshold value control signal 104 to level "3" results in a high-level frequency signal of 60%, and finally setting the threshold value offset of the threshold value control signal 104 to level "4" results in a high-level frequency signal of 100%, the threshold value offset setting of the threshold value control signal 104 is determined to be level "3." As described above, the first specific example is a method in which the threshold value offset of the threshold value control signal 104 is sequentially set to all the levels, and then the level of the threshold value offset setting which results in a high-level frequency signal 103 most closely approximating 50% is determined to be the threshold value control signal 104.

<Second Specific Example of Threshold Value Correction>

A second specific example of threshold value correction will be described below. The second specific example is a method in which the threshold value offset of the threshold value control signal 104 is set to a predetermined level, and based on a high-level frequency signal obtained from the filter 202 in this state, a level of a threshold value offset setting of a next threshold value control signal 104 is determined. In this method, for example, when the high-level frequency signal 103 is higher than 50%, a threshold value offset of the next threshold value control signal 104 is reduced. In contrast, when the high-level frequency signal 103 is lower than 50%, the level of the threshold value offset setting of the next threshold value control signal 104 is increased. It is provided that a level of a previous threshold value offset setting and the level of the next threshold value offset setting are adjacent to each other, and when the previous threshold value offset setting results in a high-level frequency signal 103 of 50% or higher, and the next threshold value offset setting results in a high-level frequency signal 103 of 50% or lower, or when the previous threshold value offset setting results in a high-level frequency signal 103 of 50% or lower, and the next threshold value offset setting results in a high-level frequency signal 103 of 50% or higher, either one of the levels of the previous and next threshold value offset settings which results in a high-level frequency signals 103 more closely approximating 50% is determined to be the threshold value control signal 104. For example, it is provided that 16 levels ("1"-"16") are available for the threshold value offset setting of the threshold value control signal 104, and when an initial threshold value offset setting to level "8" results in a high-level frequency signal of 80%, the threshold value offset setting is lowered to level "4." If this results in a high-level frequency signal of 30%, the threshold value offset setting is then increased to level "6." If this results in a high-level frequency signal of 55%, the threshold value offset setting is reduced to level "5." If this results in a high-level frequency signal of 40%, the threshold value offset setting is determined to be "6."

Figure 2:
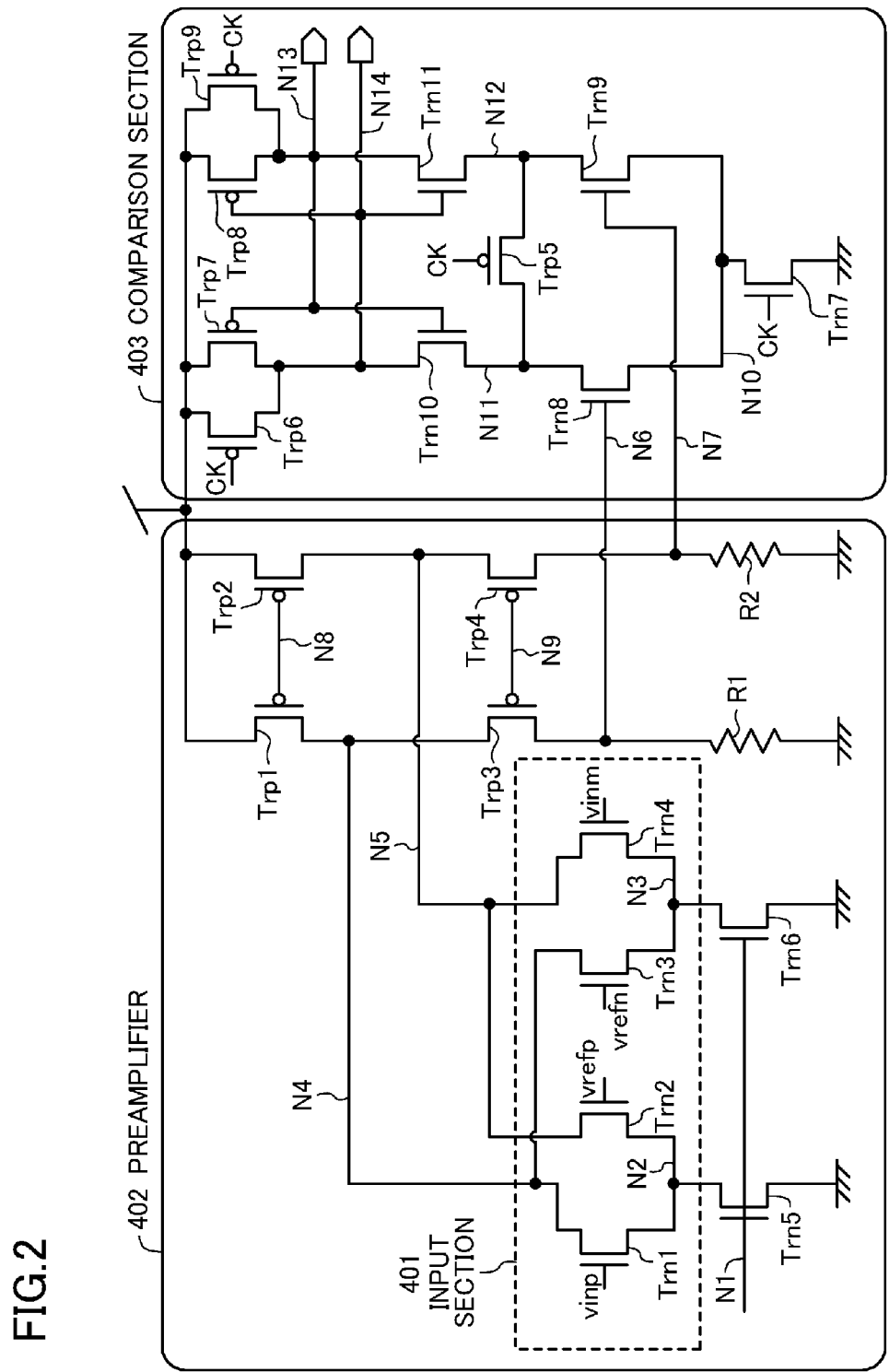
FIG. 2 is a block diagram illustrating an internal configuration of a comparator provided for the comparator offset correction device.

Next, specific correction of the threshold value in the comparator 201 will be described. FIG. 2 shows an example of a differential comparator circuit provided with a preamplifier. In the figure, reference symbol vinp denotes a positive input signal having a positive polarity, reference symbol vinm denotes a negative input signal having a negative polarity, reference symbol vrefp denotes a reference voltage having the positive polarity, reference symbol vrefm denotes a reference voltage having the negative polarity, reference symbols N1-N14 denote nodes, reference symbols Trn1-Trn11 denote n-channel transistors, reference symbols Trp1-Trp9 denote p-channel transistors, and reference symbols R1-R2 denote resistors.

Moreover, in FIG. 2, an input section 401 includes the transistors Trn1-Trn4 to which differential reference voltages Vrefp, Vrefm and differential input signals Vinp, Vinm are input. A preamplifier 402 including the input section 401 amplifies a voltage difference between the input signal and the reference voltage, and outputs the amplified difference to a comparison section 403. The comparison section 403 compares both voltages at the node N6 and the node N7 which are outputs from the preamplifier 402 with each other, and when the voltage at the node N6 is higher, the comparator 403 sets the output node N14 to a low level and the output node N13 to a high level, whereas when the voltage at the node N7 is higher, the comparator 403 sets the output node 13 to the low level and the output node N14 to the high level.

In the differential comparator circuit provided with the preamplifier of FIG. 2, the threshold value offset is set in various methods. The methods are, for example, changing the aspect ratio of at least one of the four transistors Trn1-Trn4 of the input section 401 of the comparator, changing the substrate voltage of at least one of the input transistors Trn1-Trn4, changing the aspect ratio of at least one of the transistors Trp1-Trp2, changing the resistance value of at least one of resistors R1, R2, extracting a current from at least one of the nodes N4-N7, and adding load capacitance to at least one of the nodes N11-N14.

As described above, a plurality of comparison results 102 from the comparator 201 are averaged in the filter 202, so that erroneous determinations of the threshold value offset amount due to noise can be reduced.

(Second Embodiment)

Figure 3:
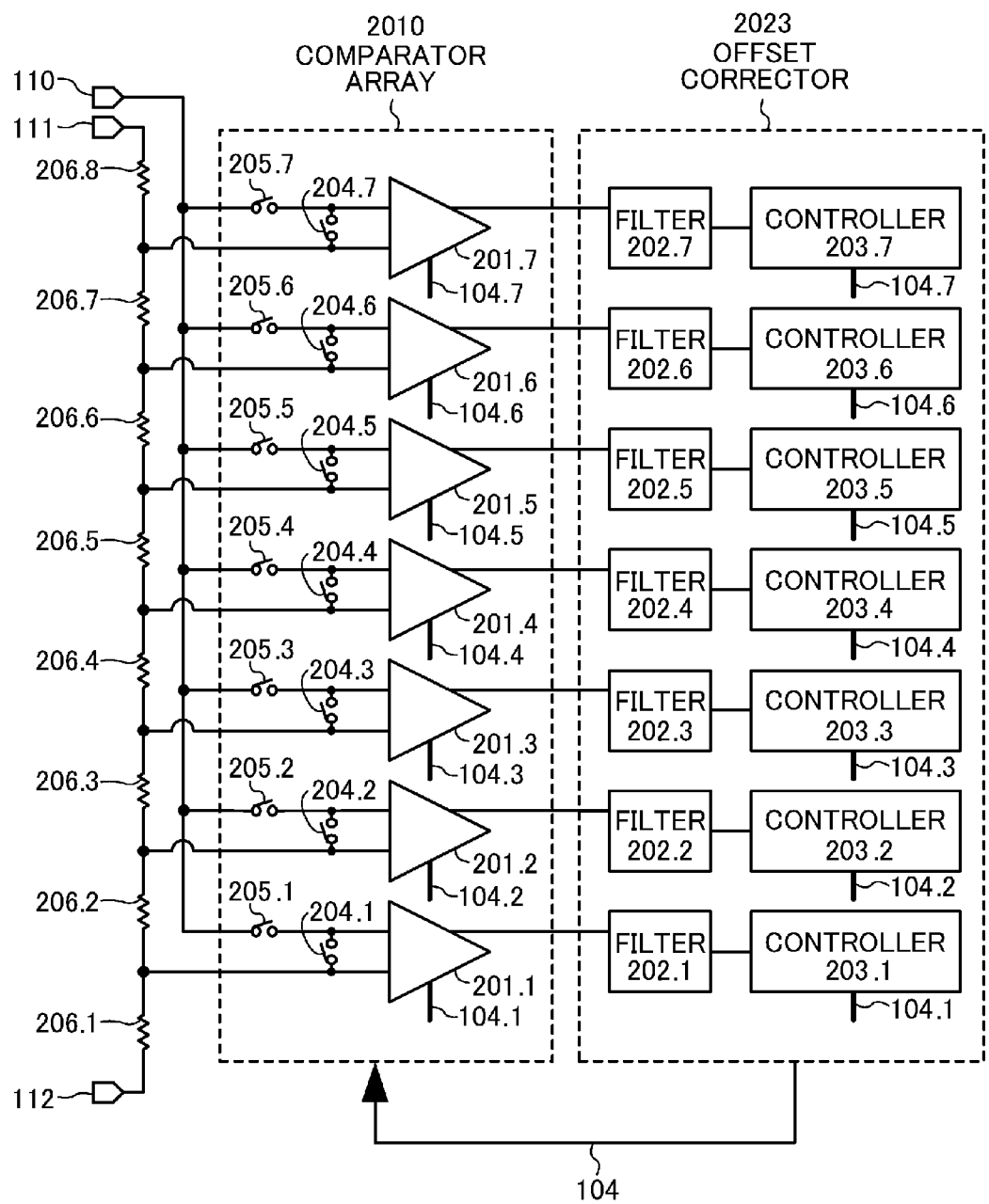
FIG. 3 is a view illustrating an overall configuration of a flash A/D converter according to a second embodiment of the invention.

FIG. 3 illustrates a second embodiment of the present invention applied to, for example, a flash A/D converter.

In FIG. 3, the description of components having the same configurations as those in FIG. 1 is omitted. In the figure, reference number 2010 denotes a comparator array, reference number 2023 denotes an offset corrector, reference numbers 201.1-201.7 denote comparators, reference numbers 202.1-202.7 denote filters, reference numbers 203.1-203.7 denote controllers, reference numbers 204.1-204.7 denote short-circuit switches, reference numbers 205.1-205.7 denote open switches, reference numbers 206.1-206.8 denote resistors, reference number 111 denotes a high reference potential, reference number 112 denotes a low reference potential, and reference numbers 104.1-104.7 denote threshold value control signals output from the offset corrector 2023.

In relation to the number of bits, which is denoted by n, of an output digital signal, the flash A/D converter illustrated in the figure has to include $(2^n-1)$ comparators. Thus, when the number of bits is large, the number of comparators is also large, so that individually measuring and correcting threshold value offsets of the comparators take a long period of correction time. For this reason, the present embodiment uses the comparator offset correction device described in the first embodiment.

That is, the open switches 205.1-205.7 are opened, positive input terminals having a positive polarity are connected to negative input terminals having a negative polarity via the short-circuit switches 204.1-204.7, and each of reference voltages set by the resistors 206.1-206.8 is input to two input terminals of corresponding one of the comparators 201.1-201.7, so that threshold value offsets of the comparators 201.1-201.7 can be individually controlled based on a plurality of comparison results of the comparators 201.1-201.7. Thus, it is possible to simultaneously and independently correct the threshold value offsets of all the comparators 201.1-201.7. Therefore, even when the number of comparators is large, an offset correction period is the same as that in the case of one comparator.

Moreover, when offset correction of the comparators 201.1-201.7 by a controller 203 is performed according to <First Specific Example of Threshold Value Correction>, threshold value offset settings of all the comparators 201.1-201.7 in the flash A/D converter can be changed with the same level settings in the process of setting the threshold value offset of a threshold value control signal 104 to every level. Thus, compared to a configuration in which each of comparators is provided with one controller 203, that is, the case where the number of controllers 203 corresponds to the total number of comparators, a significantly small-sized circuit configuration can be obtained since the controllers 203.1-203.7 can integrally be formed as one shared controller. On the other hand, when the offset correction is performed according to <Second Specific Example of Threshold Value Correction>, the level of the next threshold value offset setting varies among comparators, and thus each of the comparators has to be provided with one controller 203. However, when the number of levels for the threshold value offset setting is large, the plurality of comparators can simultaneously perform level settings, so that the correction period can be shortened.

Moreover, since the filters 202.1-202.7 and the controllers 203.1-203.7 can be formed by digital circuits, so that the filters and controllers can be integrated into and arranged as the offset corrector 2023, which allows a simple layout using space effectively.

(Third Embodiment)

Figure 4:
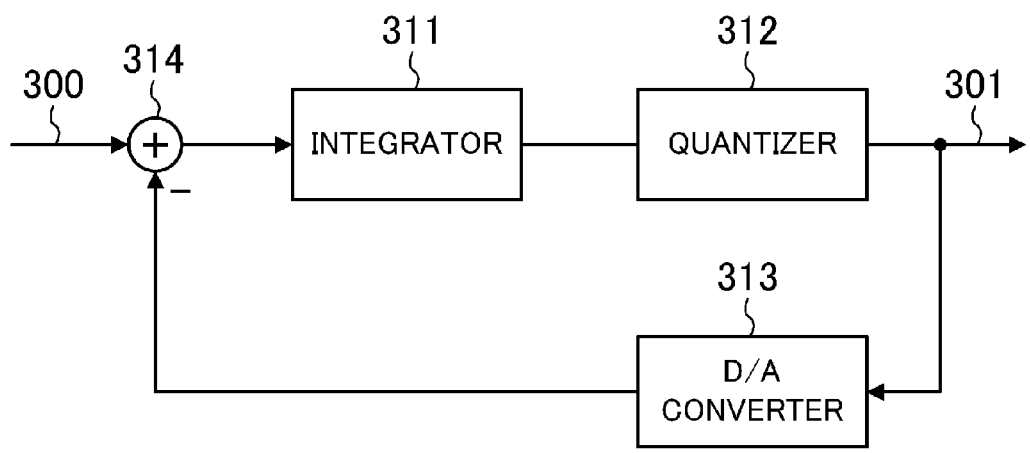
FIG. 4 is a block diagram illustrating an overall configuration of a delta sigma A/D converter according to a third embodiment of the invention.

FIG. 4 illustrates a third embodiment of the present invention applied to, for example, a delta sigma ($\Delta\Sigma$) A/D converter.

The figure illustrates a block diagram of the $\Delta\Sigma$ A/D converter, where reference number 300 denotes an input analog signal, reference number 301 denotes an output digital signal after A/D conversion, reference number 311 denotes an integrator, reference number 312 denotes a quantizer, reference number 313 denotes a D/A converter, and reference number 314 denotes a computing element (adder). The computing element 314 performs addition of the input analog signal and a feedback signal from the D/A converter 313, and the integrator 311 integrates an output of the addition from the computing element 314. The quantizer 312 quantizes the output of the integrator 311 and outputs a digital signal 301. The D/A converter 313 performs D/A conversion of the output digital signal 301, and feeds back an analog signal obtained by the D/A conversion to the computing element 314 as a feedback signal.

Here, the quantizer 312 includes the comparator offset correction device described in the first embodiment or the flash A/D converter described in the second embodiment. When the threshold voltage of the quantizer 312 in the ΔΣ A/D converter of FIG. 4 differs from a design value, distortion components are caused, which increases noise, thereby reducing the signal to noise plus distortion ratio (SNDR). For this reason, when a high SNDR is required, an acceptable range of variations in threshold voltage is very narrow. Thus, using the comparator offset correction device or the flash A/D converter of the first or second embodiment can accurately correct the threshold value offset of the comparator without causing distortion components, so that the high SNDR can be achieved.

As described above, in offset correction of the threshold value of the comparator, the present invention can reduce the influence of noise, and can reduce erroneous determinations of the threshold value offset amount due to the noise, so that the present invention is applicable to and useful for flash A/D converters, or delta sigma converters.

What is claimed is:

1. A comparator offset correction device comprising:
   a comparator configured to compare an input signal input to a first input terminal with a reference voltage input to a second input terminal;
   an open switch configured to open a path of the input signal to the first input terminal of the comparator;
   a short-circuit switch configured to equalize a voltage at the first input terminal of the comparator with a voltage at the second input terminal of the comparator;
   a controller configured to allow the comparator to perform comparison operation more than once with the open switch being open and the short-circuit switch being closed; and
   a filter configured to output a frequency signal obtained by smoothing a plurality of comparison results of the comparator, wherein
   the controller generates a threshold value control signal of the comparator based on the frequency signal of the filter, controls a threshold value of the comparator based on the threshold value control signal, and allows the comparator to perform the comparison operation more than once based on the controlled threshold value.

2. The comparator offset correction device of claim 1, wherein
   the filter computes a ratio of an output count of a high-level or low-level voltage to a total number of comparison performed in the comparator, and outputs the obtained ratio as the frequency signal.

3. The comparator offset correction device of claim 1, wherein
   when the frequency signal is higher than or lower than 50%, the controller controls the threshold value control signal input to the comparator so that the frequency signal approximates 50%.

4. The comparator offset correction device of claim 2, wherein
   when the frequency signal is higher than or lower than 50%, the controller controls threshold value control signal input to the comparator so that the frequency signal approximates 50%.

5. The comparator offset correction device of claim 1, wherein
   when a plurality of levels are available for changing the threshold value of the comparator, the controller sequentially outputs threshold value control signals at all the levels to the comparator, and receives frequency signals at all the levels from the filter to determine one of the threshold value control signals which corresponds to a frequency signal most closely approximating 50%.

6. The comparator offset correction device of claim 2, wherein
   when a plurality of levels are available for changing the threshold value of the comparator, the controller sequentially outputs threshold value control signals at all the levels to the comparator, and receives frequency signals at all the levels from the filter to determine one of the threshold value control signals which corresponds to a frequency signal most closely approximating 50%.

7. A flash A/D converter comprising:
   the comparator offset correction device of claim 1, wherein the comparator offset correction device includes a plurality of comparator offset correction devices.

8. A flash A/D converter comprising:
   the comparator offset correction device of claim 2, wherein the comparator offset correction device includes a plurality of comparator offset correction devices.

9. The flash A/D converter of claim 7, wherein
   the plurality of comparator offset correction devices include one shared controller.

10. A delta sigma A/D converter comprising:
    an adder configured to receive an analog signal;
    an integrator configured to integrate an output of the adder;
    a quantizer configured to quantize an output of the integrator and output the quantized output as a digital signal; and
    a D/A converter configured to perform D/A conversion of the digital signal from the quantizer and feed back an analog signal obtained by the D/A conversion to the adder; wherein
    the quantizer includes the comparator offset correction device of claim 1.

* * * * *